United States Patent
Ochi

(10) Patent No.: US 7,240,269 B2
(45) Date of Patent: Jul. 3, 2007

(54) TIMING GENERATOR AND SEMICONDUCTOR TESTING DEVICE

(75) Inventor: Takashi Ochi, Tokyo (JP)

(73) Assignee: Advantest Corp., Tokyo (JP)

( * ) Notice: Subject to any disclaimer, the term of this patent is extended or adjusted under 35 U.S.C. 154(b) by 145 days.

(21) Appl. No.: 11/126,038

(22) Filed: May 10, 2005

(65) Prior Publication Data

US 2005/0273684 A1    Dec. 8, 2005

(30) Foreign Application Priority Data

May 11, 2004  (JP)  ............................. 2004-141547

(51) Int. Cl.
   *G01R 31/28*    (2006.01)
   *G06F 11/00*    (2006.01)
   *G06F 1/12*     (2006.01)

(52) U.S. Cl. ..................... 714/744; 714/815; 713/401

(58) Field of Classification Search ............... None
   See application file for complete search history.

(56) References Cited

U.S. PATENT DOCUMENTS

| | | | |
|---|---|---|---|
| 6,829,715 B2 * | 12/2004 | Chiao et al. | 713/401 |
| 6,928,570 B2 * | 8/2005 | Fukuda | 713/400 |
| 7,069,458 B1 * | 6/2006 | Sardi et al. | 713/401 |
| 7,107,477 B1 * | 9/2006 | Singh et al. | 713/503 |

FOREIGN PATENT DOCUMENTS

| | | |
|---|---|---|
| JP | 03-090874 | 4/1991 |
| JP | 05-087878 | 4/1993 |
| JP | 10-319097 | 12/1998 |
| JP | 11-125660 | 5/1999 |
| JP | 2001-133525 | 5/2001 |

* cited by examiner

*Primary Examiner*—Christine T. Tu
(74) *Attorney, Agent, or Firm*—Muramatsu & Associates

(57) ABSTRACT

A timing generator f or a semiconductor test device reduces pattern-dependent jitters and timing errors of timing pulse signals. In the timing generator, a delaying circuit (variable delaying means, clock signal delaying circuit) is disposed on an input terminal side of a clock signal of a signal input/output circuit having the flip-flop (reference signal delaying means) which outputs an output signal in accordance with an input timing of the delayed clock signal. The clock signal is delayed by the delaying circuit. The clock signal delaying circuit may be replaced with a phase locked loop circuit.

5 Claims, 7 Drawing Sheets

→ (1)
→ (2) LARGE INFLUENCE
→ (3) SMALL INFLUENCE

→ (1)
--→ (2) NONE
--→ (3) NONE

→ (2) LARGE INFLUENCE

TIMING GENERATOR AND SEMICONDUCTOR TESTING DEVICE

BACKGROUND OF THE INVENTION

1. Field of the Invention

The present invention relates to a timing generator which generates a test periodic signal of a whole testing device or a timing pulse signal for matching a test timing, and a semiconductor testing device provided with this timing generator.

2. Description of the Related Art

Prior to the description of the present invention, the outline of a conventional semiconductor testing device will be described with reference to FIG. 5.

In a semiconductor testing device 1 in which a semiconductor integrated circuit (device under test: DUT) 10 is a test object, as shown in FIG. 5, a major constitution comprises a test processor (not shown) which controls an overall procedure of the semiconductor testing device 1; a pattern generator 11 which generates a test pattern, an expected value pattern and the like; a waveform formatter 12 which formats the test pattern from the pattern generator 11 into a test signal waveform to send the waveform to the DUT 10 via a driver 14; a pattern comparator 13 which logically compares a test result sent from the DUT 10 via a comparator 15 with the expected value pattern from the pattern generator 11 to detect agreement (match) and disagreement (mismatch) and to judge whether or not the DUT 10 is satisfactory; and a timing generator 20 which generates a timing pulse signal and which supplies the timing pulse signal to the waveform formatter 12, comparator 15, pattern comparator 13 and the like to take a test timing.

As shown in FIG. 6, the timing generator 20 has a period generating section 21 which determines the test period of an overall system of the semiconductor testing device 1; and a plurality of delay generating sections 22-1 to 22-n for providing predetermined timings to pins of an LSI of the DUT 10 and the pattern comparator 13.

Among them, each of the delay generating sections 22-1 to 22-n has period calculation means 23 for calculating fraction data of a pattern period based on pattern period data (R1), and sending the fraction data in synchronization with period start data from an input terminal a0; delay calculation means 24 for adding up the fraction data from this period calculation means 23 and setting delay data (R2) to output integer data and fraction data; reference signal delaying means 310 for delaying a reference signal (reference clock) from the period generating section 21 by the integer data from this delay calculation means 24; and variable delaying means 320 for delaying the reference signal from the reference signal delaying means 310 by the fraction data from the delay calculation means 24 to output a timing pulse signal (e.g., see Japanese Patent Application Laid-Open No. 11-125660).

In this constitution, the timing generator 20 can generate the timing pulse signal delayed by a desired time to send the signal to the pattern comparator 13 or the like.

It is to be noted that, as shown in FIG. 6, a part which includes the period calculation means 23 and the delay calculation means 24 and which calculates a delay time of the reference signal is referred to as delay time calculation means A. Furthermore, a part which includes the reference signal delaying means 310 and the variable delaying means 320 and which delays the reference signal is referred to as a signal input/output circuit 300.

It is to be noted that, as shown in FIG. 6, a part which includes the period calculation means 23 and the delay calculation means 24 is referred to as delay time calculation means A which calculates a delay time of the reference signal. Furthermore, a part which includes the reference signal delaying means 310 and the variable delaying means 320 is referred to as a signal input/output circuit 300, which delays the reference signal.

FIG. 7 is a circuit diagram showing a condition in which this pattern-dependent jitter is generated. This drawing shows a circuit constitution of the signal input/output circuit 300 in which an input data signal (Data) is synchronized with a clock signal (Clock), further delayed by a predetermined time, and output to the outside.

This signal input/output circuit 300 will be further described. The circuit has a flip-flop 310 (corresponding to the reference signal delaying means 310 in FIG. 6) which outputs the input data signal (corresponding to the reference signal sent from the period generating section 21 to each of the delay generating sections 22-1 to 22-n in the conventional timing generator 20 (FIG. 6)) in accordance with an input timing of the clock signal (clock for counting an output timing); and a delaying circuit 320 (corresponding to the variable delaying means 320 in FIG. 6) which is connected to an output terminal side of the flip-flop 310 and which delays the output data signal by a predetermined time and then outputs the signal to the outside.

Assuming that the data signal has a random pattern (pattern in which a pulse wave is generated at random) and the clock signal has a continuous pattern (pattern in which the pulse wave is continuously generated in a certain period), the delaying circuit 320 is connected to a path (random pattern passage shown by C in FIG. 7) through which the pulse wave passes in the random pattern, and the pattern-dependent jitter is easily generated in the random pattern passage.

Here, the pattern-dependent jitter includes a short term jitter and a thermal drift jitter.

First, the short term jitter will be described. The short term jitter means that one edge (noted edge or subject edge) is influenced by a past edge to produce a fluctuation in a case where a plurality of pulse waves are generated.

For example, when the pulse wave is continuously generated as shown in FIG. 8(a), a noted edge (edge marked with ●) is influenced by a past edge (edge marked with ○ in the pulse wave having the edge marked with ●, (1) of FIG. 8(a)) in the pulse wave having the noted edge, and edges (edges marked with ○ in the past pulse wave other than the pulse wave having the edge marked with ●, FIGS. 8(a)(2), (3)) in the pulse wave generated in the past.

On the other hand, when the pulse wave is generated in the state of a single shot as shown in FIG. 8(b), the noted edge is mainly influenced by the past edge (edge marked with ○) in the pulse wave having the noted edge (FIGS. 8(b)(1)).

In this case, another pulse wave is sometimes generated at random at the most recent time as viewed from the pulse wave having the noted edge, i.e., immediately prior to the noted edge. For example, when the pulse wave is generated at the most recent time, the noted edge is influenced by each edge of the past pulse wave in the same manner as in FIGS. 8(a)(2). On the other hand, when any pulse wave is not generated at this time, the edge is not influenced thereby (see FIGS. 8(b)(2), (3)).

Here, the edge influencing the noted edge in a case where the pulse wave is continuously generated is compared with the edge influencing the noted edge in a case where the pulse wave is generated in a manner of single eruption.

First, either of the past edges in the pulse waves having the noted edges have an influence in common (FIGS. 8(a)(1) and 8(b)(1)).

Next, the edge of the pulse wave, generated a certain time or more before the generation time of the noted edge, has some influence, but such influence is very small and can be ignored (FIGS. 8(a) (3) and 8(b) (3)).

Moreover, as to each edge in the pulse wave generated in a past time range in the vicinity of the generation time of the pulse wave having the noted edge, the influence of the edge differs in a case where the pulse wave is continuously generated and a case where the pulse wave is generated in the state of the single shot.

For example, in a case where the pulse wave is continuously generated, as shown in FIG. 8(a), each edge of the pulse wave generated in the past has a large influence on the noted edge (FIGS. 8(a)(2)).

On the other hand, in a case where the pulse wave is generated in the state of the single shot, the pulse wave has not been generated or has been generated in the past time range in the vicinity of the generation time of the pulse wave having the noted edge.

In a case where the pulse wave was generated in the past, the noted edge is largely influenced in the same manner as in a case where the pulse wave is continuously generated. On the other hand, when the pulse wave has not been generated, any pulse wave does not exist, and therefore the noted edge is not influenced as shown in FIG. 8(b).

Therefore, an influence exerted upon the noted edge in the continuous generation of the pulse wave differs from an influence exerted upon the noted edge in the single generation of the pulse wave in accordance with whether or not the pulse wave was generated in the past in a time range in the vicinity of the generation time of the pulse wave having the noted edge.

That is, in a case where the pulse wave is continuously generated, the pulse wave has been securely generated in the past time range in the vicinity of the generation time of the pulse wave having the noted edge, and the influences exerted upon the noted edge by the other edges are constant. Therefore, any short term jitter does not have to be considered in a path (continuous clock passage) through which the continuous pulse wave passes.

On the other hand, in a case where the pulse wave is generated in the state of the single shot, a degree of the influence differs whether or not the pulse wave has been generated in the past time range in the vicinity of the generation time of the pulse wave having the noted edge. That is, a pattern (FIG. 8(c)) influenced by the past edge, and a pattern (FIG. 8(d)) hardly influenced by the past edge are generated at random, and accordingly the influences are not constant. Therefore, in a path through which the pulse wave generated by the single shot passes (random pattern passage), the influence exerted upon the noted edge changes, and the pattern-dependent jitter (short term jitter) is generated.

Next, the thermal drift jitter will be described. The thermal drift jitter means that the fluctuation is generated in the waveform under the influence of a temperature change.

The delaying circuit 320 shown in FIG. 7 has, for example, the arbitrary number of (usually several tens to hundreds) inverters 321 shown in FIG. 9. When the number of the inverters 321 is increased, the delay time can be increased.

In each inverter 321 is provided with transistors 322 as shown in FIG. 9. In each transistor 322, the temperature changes with the generated pattern of the pulse wave, and a voltage between base and emitter ($V_{BE}$) fluctuates.

In each inverter 321 is provided with transistors 322 as shown in FIG. 9. In each transistor 322, the temperature changes with the generated pattern of the pulse wave, and a voltage across the base and emitter ($V_{BE}$) of the transistor fluctuates.

For example, in the continuous clock passage, since the pulse wave is continuously generated, the temperature change is substantially constant. On the other hand, in the random pattern passage, since the pulse wave is generated in the state of the single shot, the temperature change is not constant. Therefore, the voltage $V_{BE}$ fluctuates, a timing to output the signal changes, and the pattern-dependent jitter (thermal drift jitter) is generated. Especially, the larger the number of the inverters 321 are, the larger the thermal drift jitter becomes.

As described above, the conventional signal input/output circuit has had a situation in which the short term jitter or the thermal drift jitter may be generated. Therefore, the timing error has been generated in the output timing pulse signal in the timing generator provided with the signal input/output circuit. Moreover, for the semiconductor testing device using the timing generator, an accurate test result cannot be obtained because of the timing error.

Additionally, as shown in FIG. 9, the delaying circuit 320 usually has a plurality of inverters 321. Therefore, the pattern-dependent jitter is added up toward subsequent stages of the inverters 321, and the timing error of the timing pulse signal is further enlarged.

The present invention has been proposed in order to solve the problem of the above-described conventional technique, and an object thereof is to provide a timing generator and a semiconductor testing device in which pattern-dependent jitters are reduced to decrease timing errors of timing pulse signals in a timing generator so that a test timing in the semiconductor testing device can be inhibited from being displaced.

SUMMARY OF THE INVENTION

According to the present invention, there is provided a semiconductor testing device having a timing generator which delays a reference signal by a predetermined time to output a timing pulse signal, wherein the timing generator comprises: delay time calculation means for calculating a delay time given to the reference signal; and a signal input/output circuit which delays the reference signal in accordance with the delay time calculated by the delay time calculation means, the signal input/output circuit comprising: a data holding circuit which inputs the reference signal and which outputs the reference signal based on an input timing of a clock signal; and a clock signal delaying circuit which delays the input timing of the clock signal in the data holding circuit based on the delay time.

When the timing generator is constituted in this manner, the delaying circuit is connected to an input terminal side on which the clock signal is input, not an output terminal side of the data holding circuit in the signal input/output circuit. Therefore, the delaying circuit of a random pattern passage can be eliminated, and pattern-dependent jitters can be reduced.

In the conventional timing generator of the semiconductor testing device, a delaying circuit (e.g., variable delaying means) has heretofore been connected to the output terminal side of a data holding circuit (e.g., reference signal delaying means including a flip-flop). The output terminal side of the data holding circuit is the random pattern passage through which a randomly generated output signal (e.g., reference signal) passes. Therefore, since the delaying circuit is connected to the passage, it has been necessary to consider the generated pattern-dependent jitter.

On the other hand, the input terminal side of the data holding circuit, on which the clock signal is input, is a continuous clock passage through which the clock signal continuously generated in a certain period passes. Therefore, when the delaying circuit (clock signal delaying circuit) is connected to this passage, the delaying circuit of the random pattern passage is eliminated, and the pattern-dependent jitters can be reduced.

Additionally, the delaying circuit, connected to the output terminal side of the data holding circuit, has a function of delaying the output signal. However, even when the clock signal is delayed instead of the output signal, the output signal is delayed. Therefore, the delaying circuit, connected to the input terminal side of the clock signal, fulfils the function of delaying the output signal.

Furthermore, when the delaying circuit is not connected to the output terminal side of the data holding circuit, but is connected to the input terminal side of the clock signal, the random pattern passage can be shortened.

Therefore, in the present invention, the delaying circuit is connected to the input terminal side on which the clock signal is input, instead of the output terminal side of the data holding circuit, so that the clock signal is delayed. Accordingly, the output signal can be delayed by a predetermined time, and the delaying circuit of the random pattern passage can be eliminated to reduce the pattern-dependent jitters.

Moreover, the timing generator of the present invention comprises: a data delaying circuit which delays the reference signal input into the data holding circuit.

Additionally, in the present invention, when the delaying circuit is connected to the continuous clock passage, the pattern-dependent jitters can be delayed. This can solve a problem that the pattern-dependent jitters increase because of a plurality of stages of inverters. That is, the more the number of the inverters disposed in the delaying circuit are, the greater an effect becomes in reducing the pattern-dependent jitters.

Moreover, the timing generator of the present invention function comprises: a data delaying circuit which delays the reference signal input into the data holding circuit.

When the timing generator is constituted in this manner, the reference signal can be delayed in accordance with the clock signal delayed by the clock signal delaying circuit.

Furthermore, the timing generator of the present invention further comprises: a phase shift circuit instead of the clock signal delaying circuit.

When the timing generator is constituted in this manner, the continuous clock passage is connected to the phase shift circuit using a phase locked loop circuit (PLL circuit), and the output signal can be delayed by a desired time. Even in this case, the delaying circuit can be eliminated on the side of the random pattern passage, and the pattern-dependent jitters can be reduced.

Additionally, in the timing generator of the present invention, the data holding circuit includes a flip-flop.

When the timing generator is constituted in this manner, the clock signal delaying circuit can be connected to the continuous clock passage to shorten the random pattern passage, and therefore the pattern-dependent jitters can be reduced even in the signal input/output circuit in which the data holding circuit comprises the flip-flop, and the timing generator including the signal input/output circuit. It is to be noted that the data holding circuit holds input data until the data is output at a certain timing, and the circuit includes, for example, a latch circuit and the like in addition to the flip-flop.

The semiconductor testing device under the present invention includes: a pattern generator which produces a test pattern and an expected value pattern; a waveform formatter which formats a waveform of the test pattern to supply the formatted pattern to a device under test; a pattern comparison unit which compares a test result from the device under test with the expected value pattern from the pattern generator to judge whether or not the device under test is satisfactory; and a timing generator which supplies a timing pulse signal to the waveform formatter to take a test timing, which is comprised as described above.

When the semiconductor testing device is constituted in this manner, the pattern-dependent jitters can be reduced, timing errors of the timing pulse signals can be reduced in the timing generator, and accordingly, the test timing in the semiconductor testing device will not be deteriorated.

According to the present invention described above, the phase shift circuit using the delaying circuit or the PLL circuit is connected to the input terminal side on which the clock signal is input, not the output terminal side of the data holding circuit (e.g., the flip-flop, etc.). Therefore, the delaying circuit can be eliminated from the random pattern passage, and the pattern-dependent jitters can be reduced.

Consequently, the timing errors of the timing pulse signals can be reduced in the timing generator, and the test timing in the semiconductor testing device will not be deteriorated.

DESCRIPTION OF THE PREFERRED EMBODIMENT

Preferable embodiments of a timing generator and a semiconductor testing device will be described hereinafter according to the present invention with reference to the drawings.

First, the embodiments of the timing generator and the semiconductor testing device will be described according to the present invention with reference to FIGS. 1 and 2.

Figure 1:
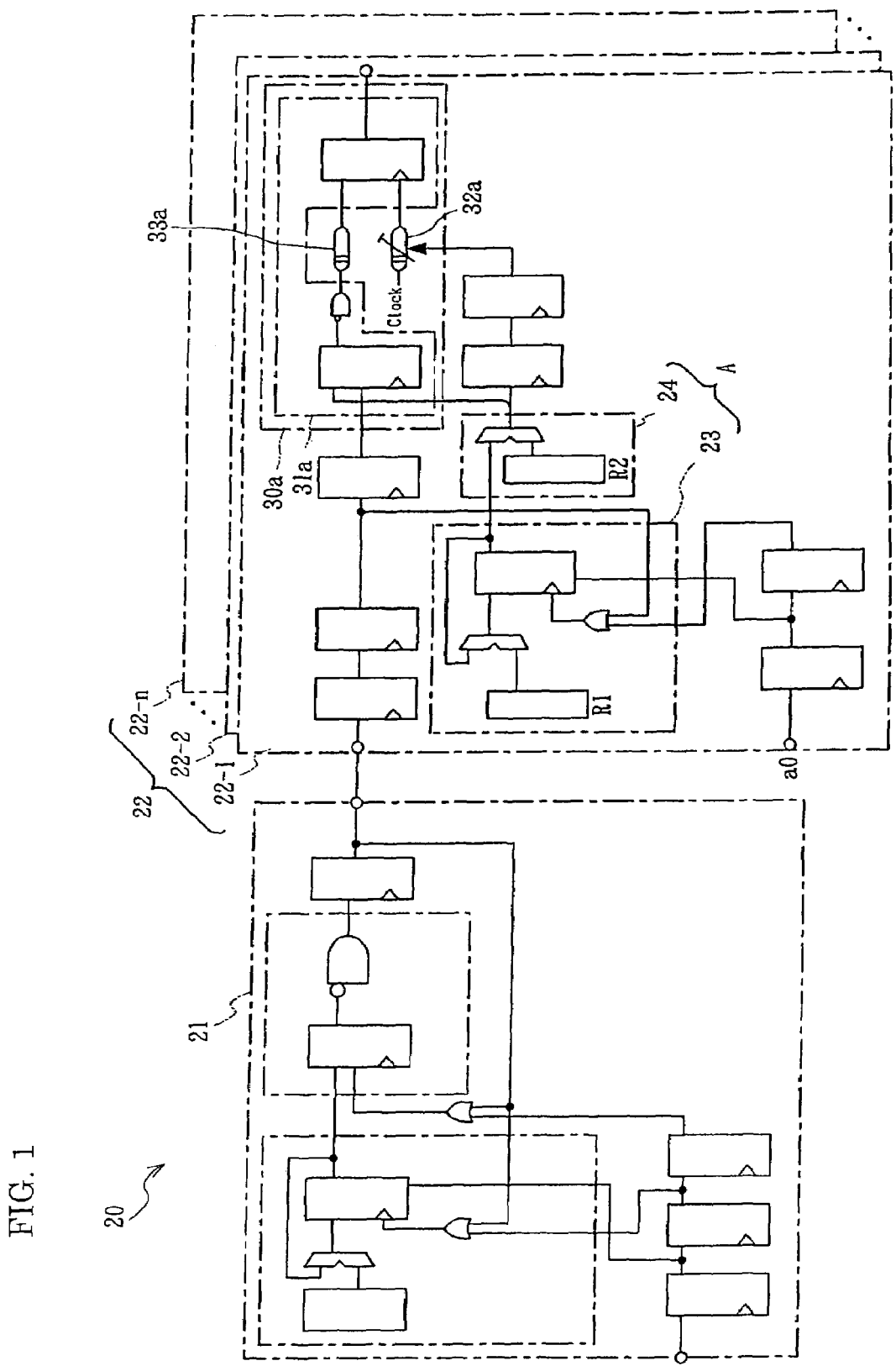
FIG. 1 is a circuit diagram showing a constitution of a timing generator of the present invention.
Figure 2:
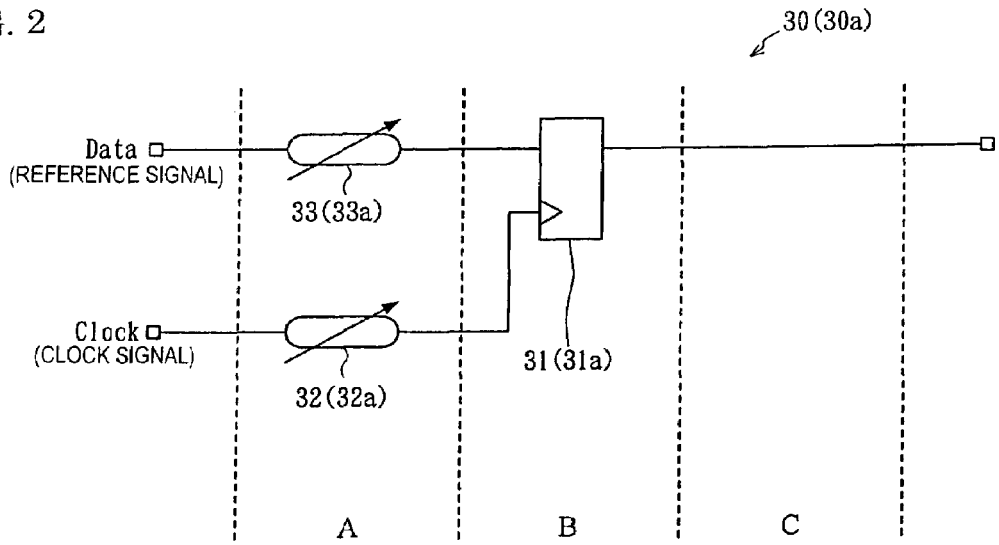
FIG. 2 is a circuit diagram showing a constitution of a signal input/output circuit of the present invention.

FIG. 1 is an electronic circuit diagram showing a circuit constitution of the timing generator of the present invention, and FIG. 2 is an electronic circuit diagram showing a circuit constitution of a signal input/output circuit.

Figure 5:
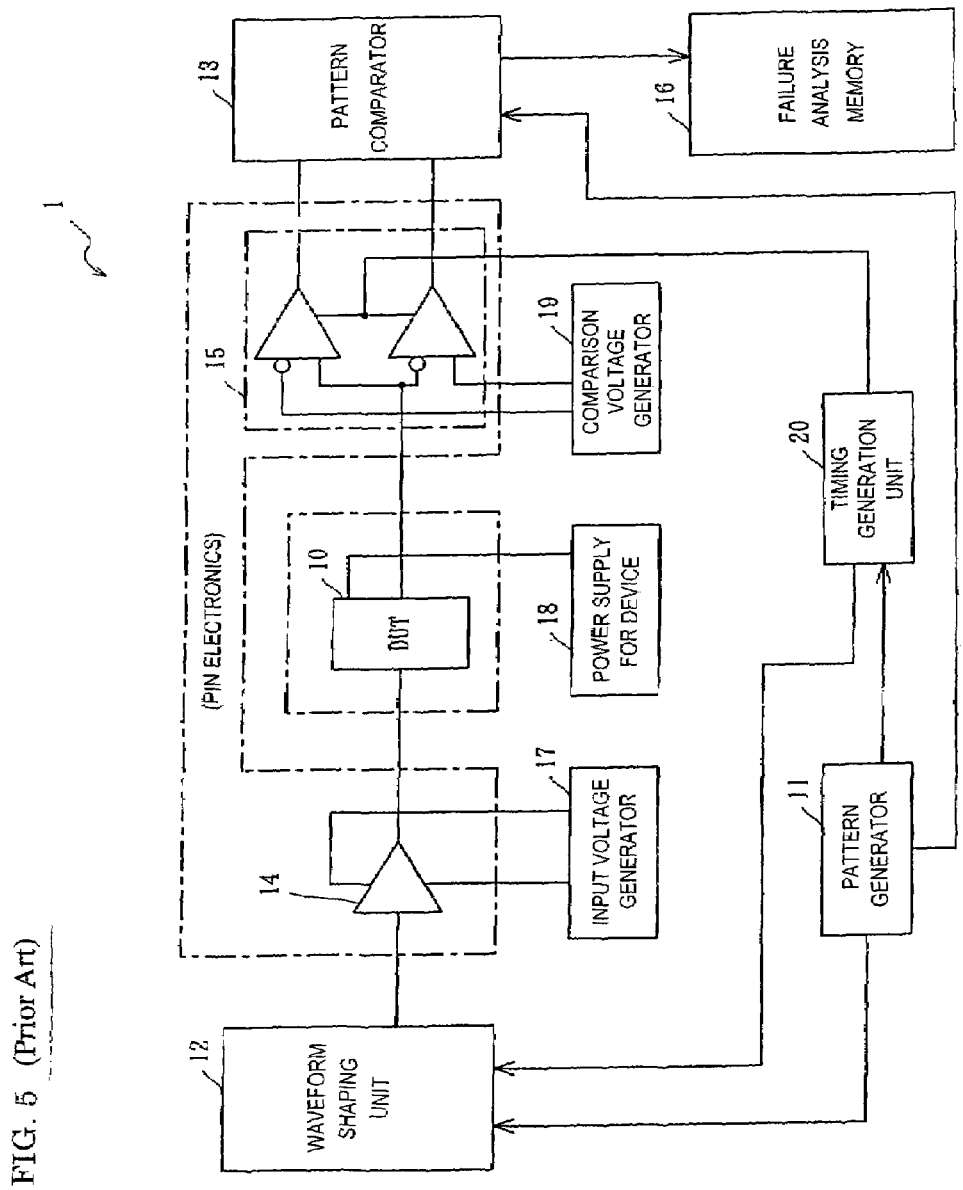
FIG. 5 is a circuit diagram showing a schematic constitution of a general semiconductor testing device.
Figure 6:
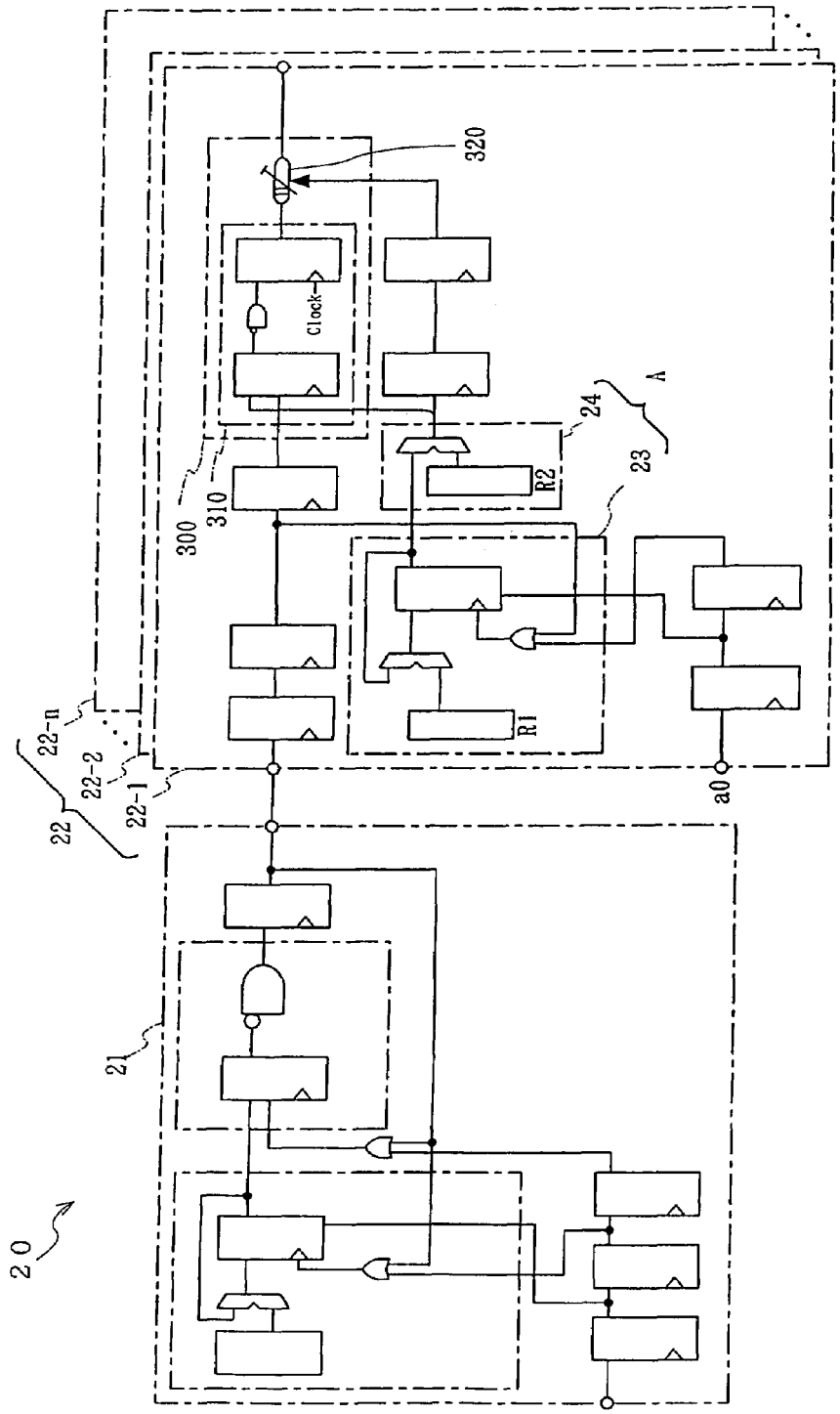
FIG. 6 is a circuit diagram showing a constitution of a conventional timing generator.
Figure 7:
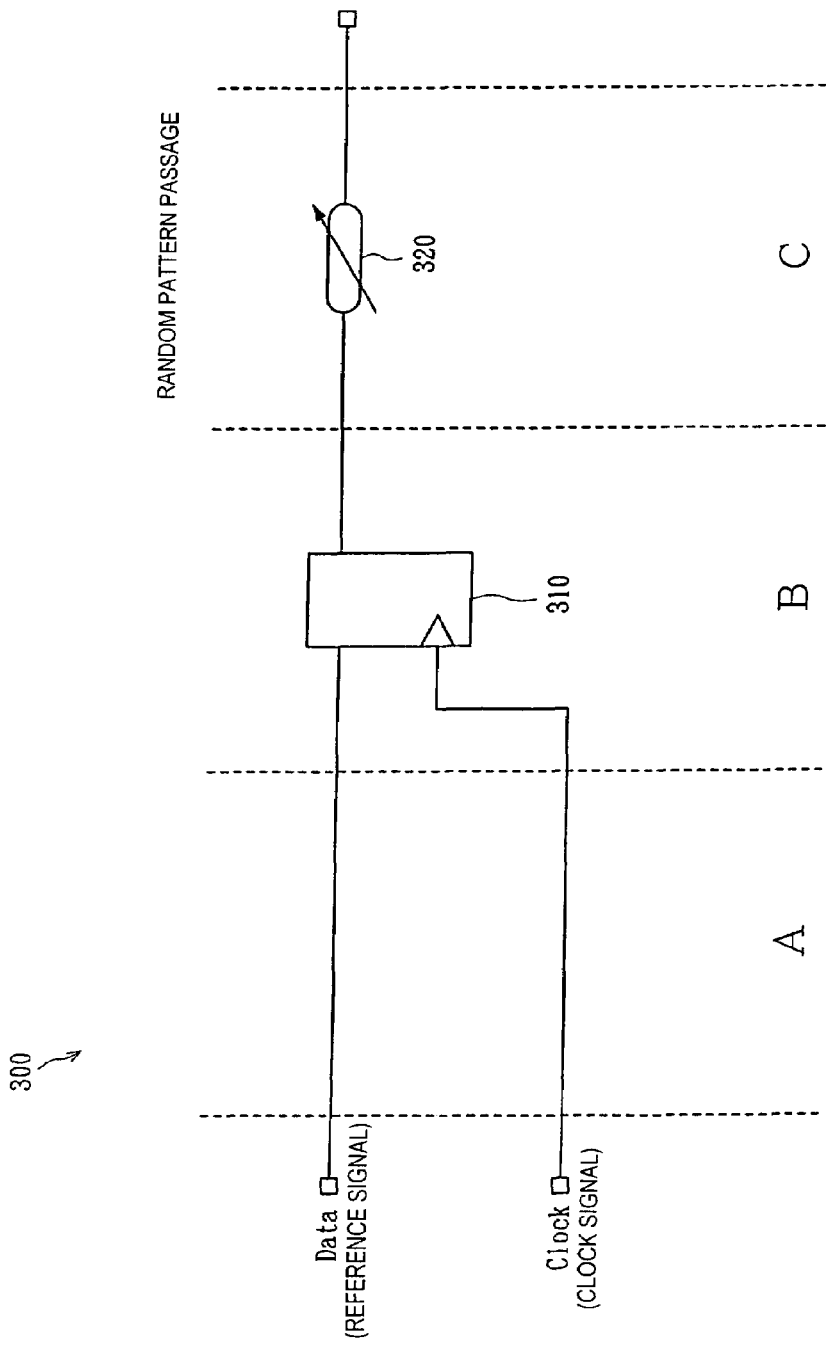
FIG. 7 is a circuit diagram showing a constitution of a conventional signal input/output circuit.
Figure 8A:
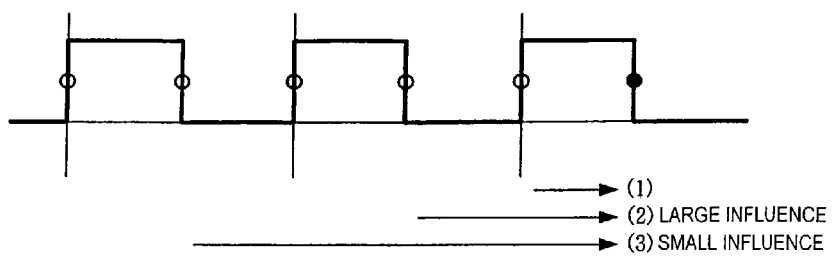
FIG. 8(a) is a waveform diagram showing that a noted edge is influenced by another edge in a case where a pulse wave is continuously generated.
Figure 8B:
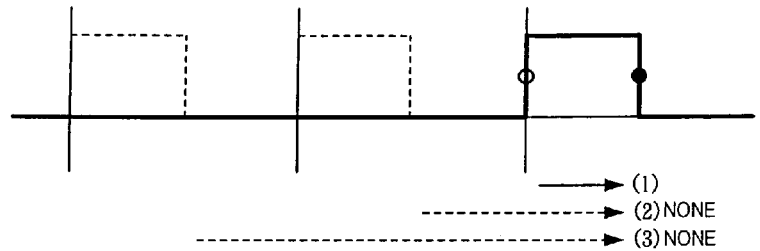
FIG. 8(b) is a waveform diagram showing that a noted edge is influenced by the other edge in a case where a pulse wave is generated in the state of a single shot.
Figure 8C:
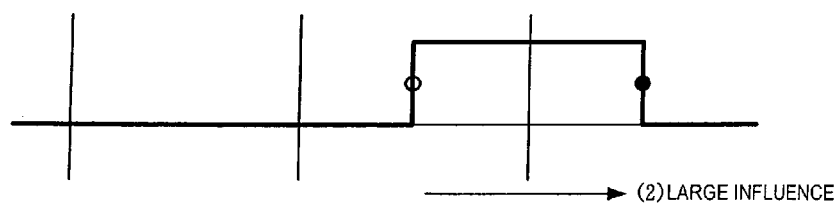
FIG. 8(c) is a waveform diagram showing that the noted edge is largely influenced by another edge.
Figure 8D:
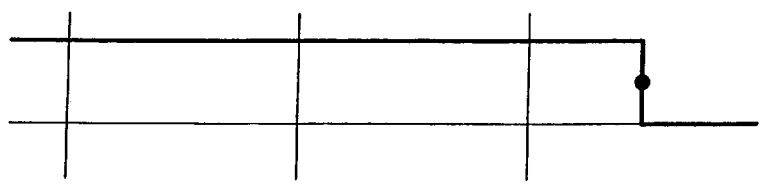
FIG. 8(d) is a waveform diagram showing that the noted edge is not influenced by another edge.
Figure 9:
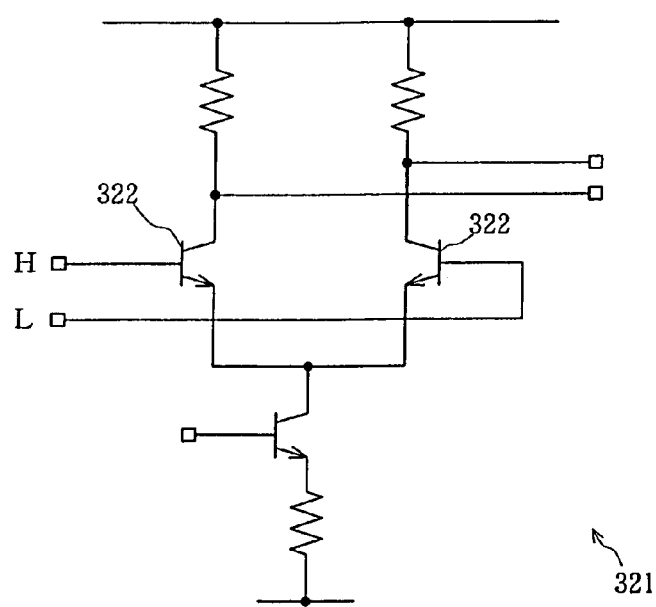
FIG. 9 is a circuit diagram showing a circuit constitution of an inverter disposed in a delaying circuit.

A timing generator 20 shown in FIG. 1 is disposed in a semiconductor testing device 1 which is similar to a conventional device shown in FIG. 5.

The semiconductor testing device 1 judges whether or not a device under test 10 (DUT) is satisfactory. As shown in FIG. 5, a major constitution of the device comprises: a pattern generator 11; a waveform formatter 12; a pattern comparator 13; a driver 14; a comparator 15; a failure analysis memory 16; an input voltage generator 17; a power supply 18 for the device; a comparison voltage generator 19; and a timing generator 20.

Here, as shown in FIG. 1, the timing generator 20 comprises: a period generating section 21; and delay generating sections 22-1 to 22-n. Furthermore, each of the delay generating sections 22-1 to 22-n has period calculation means 23, delay calculation means 24, and signal input/output circuit 30a.

It is to be noted that in FIG. 1, the period calculation means 23 and delay calculation means 24 are disposed in each of the delay generating sections 22-1 to 22-n, but the period calculation means 23 and delay calculation means 24 are not limited to the delay generating sections 22-1 to 22-n, and may be disposed in the period generating section 21.

Moreover, in the present embodiment, as shown in FIG. 1, the period calculation means 23 and delay calculation means 24 constitute delay time calculation means A.

As shown in FIG. 1, the signal input/output circuit 30a comprises reference signal delaying means 31a, variable delaying means 32a, and data delaying means 33a.

The signal input/output circuit 30a constituted in this manner delays a reference signal by a predetermined time to output the signal. The signal input/output circuit 30, which is also referred to as the signal input/output circuit 30a in this embodiment, comprises: a flip-flop 31; a clock signal delaying circuit 32; and a data delaying circuit 33 as shown in FIG. 2.

The flip-flop (data holding circuit) 31 outputs an input data signal (Data) in accordance with an input timing of a clock signal (Clock). The flip-flop 31 corresponds to the reference signal delaying means 31a in FIG. 1.

The clock signal delaying circuit 32 is connected to the input terminal side of the clock signal in the flip-flop 31, and delays the clock signal.

A path connected to the clock signal delaying circuit 32 is a continuous clock passage through which a clock signal passes where the clock signal is a pulse wave continuously generated for a certain period. When the delaying circuit for delaying an output signal of the flip-flop 31 is connected to the input terminal side of the clock signal, not an output terminal side of the flip-flop 31, pattern-dependent jitters can be reduced. This clock signal delaying circuit 32 corresponds to the variable delaying means 32a in FIG. 1.

The data delaying circuit 33 needs to be connected, because the connection of the clock signal delaying circuit 32 is switched from the output terminal side (conventional technology) of the flip-flop 31 to the input terminal side (present invention) of the clock signal. That is, when an input timing of the clock signal is slightly delayed by the clock signal delaying circuit 32, a data signal needs to be matched to the input timing of the clock signal. This data delaying circuit 33 corresponds to the data delaying means 33a in FIG. 1.

The data delaying circuit 33 needs to be connected, because the connection of the clock signal delaying circuit 32 is switched from the output terminal side of the flip-flop 31 to the input terminal side of the clock signal. That is, when an input timing of the clock signal is slightly delayed by the clock signal delaying circuit 32, a data signal is adapted to the input timing of the clock signal. This data delaying circuit 33 corresponds to data delaying means 33a in FIG. 1.

When the signal input/output circuit 30 is constituted in this manner, the clock signal delaying circuit 32 is connected to the input terminal side (continuous clock passage) of the clock signal, not the output terminal side (random pattern passage) in the flip-flop 31. Therefore, it is not necessary to dispose a delaying circuit for timing setting in the random pattern passage (shown by C in FIG. 2), and the pattern-dependent jitters can be reduced.

Accordingly, in the timing generator provided with the signal input/output circuit, timing errors of timing pulse signals can be reduced. In a semiconductor testing device provided with this timing generator, test timing can be free from the timing errors.

Figure 3:
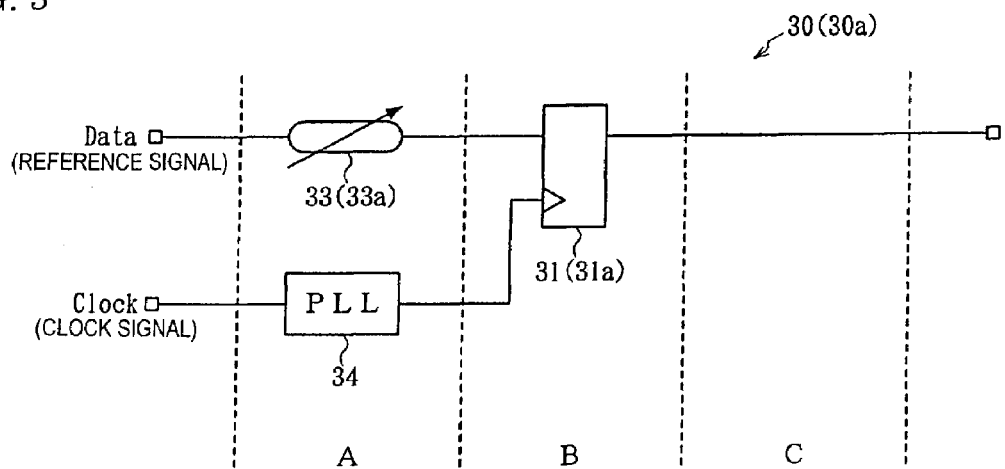
FIG. 3 is a circuit diagram showing another constitution of the signal input/output circuit of the present invention.

In the foregoing description, the clock signal delaying circuit 32 is used as means for delaying the clock signal in the signal input/output circuit 30. However, as shown in FIG. 3, the clock signal delaying circuit 32 may be replaced with a phase shift circuit 34 using a phase locked loop circuit (PLL circuit)

The PLL circuit is an electronic circuit which matches an input signal or a reference frequency with a frequency of an output signal. When the phase shift circuit 34 having the PLL circuit is used, a phase difference between the input and output signals can be detected, a loop of a voltage control oscillator or a circuit is controlled, and accordingly a signal having a correctly synchronized frequency can be transmitted.

Figure 4:
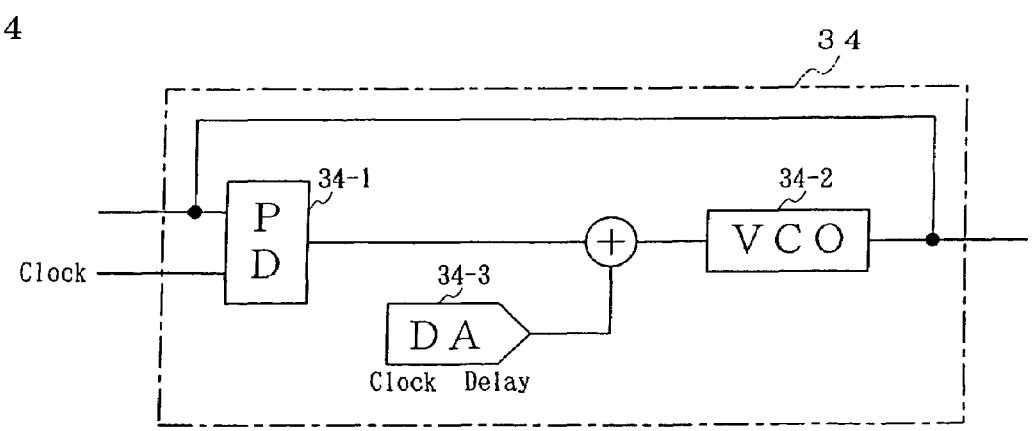
FIG. 4 is a circuit diagram showing a constitution of a phase shift circuit using a PLL circuit.

An inner constitution of this phase shift circuit 34 is shown in FIG. 4.

As shown in the figure, the phase shift circuit 34 has a phase detector 34-1, a voltage controlled oscillator 34-2, and a phase shift amount generator 34-3.

The phase detector (PD) 34-1 outputs a phase difference between a reference frequency signal and an output signal of the voltage control oscillator 34-2 in the form of a voltage (or a current).

The voltage controlled oscillator (VCO) 34-2 changes the frequency in accordance with the voltage.

The phase shift amount generator 34-3 produces a voltage (or a current) to generate a predetermined amount of clock delay to the voltage (or the current) output from the phase detector 34-1.

When the phase shift circuit 34 constituted in this manner is connected to the input terminal side of the clock signal in the flip-flop 31, the delaying circuit can be removed from the random pattern passage, and the predetermined delay amount can be imparted to the output signal without causing any pattern-dependent jitter.

As described above, the preferable embodiments of the signal input/output circuit, timing generator, and semiconductor testing device have been described according to the present invention, but the signal input/output circuit, timing generator, and semiconductor testing device of the present invention are not limited to the above-described embodiments, and, needless to say, various modifications are possible in the range of the present invention.

For example, in the above-described embodiment, the signal input/output circuit has a circuit constitution having the flip-flop and delaying circuit, but is not limited to the constitution having the flip-flop and delaying circuit, and another circuit element may be disposed.

Moreover, only one flip-flop is disposed in the signal input/output circuit in FIG. 2 or the like, but the present invention is not limited to one flip-flop, and a plurality of flip-flops may be disposed. In this case, the clock signal delaying circuit can be connected to a clock input terminal of one flip-flop, or may be connected to clock input terminals of two or more flip-flops.

Since the present invention relates to a timing generator capable of reducing timing errors of timing pulse waves, the present invention is preferably usable in a device, apparatus or the like which performs a predetermined operation using the timing pulse waves.

What is claimed is:

1. A semiconductor testing device comprising:
   a pattern generator which produces a test pattern and an expected value pattern;
   a waveform formatter which formats a waveform of the test pattern to supply the formatted pattern to a device under test;
   a pattern comparison unit which compares a test result from the device under test with the expected value pattern from the pattern generator to judge whether or not the device under test is satisfactory; and
   a timing generator which supplies a timing pulse signal to the waveform formatter to take a test timing, wherein the timing generator comprises:
      a delay time calculation means for calculating a delay time given to the reference signal; and
      a signal input/output circuit which delays the reference signal in accordance with the delay time calculated by the delay time calculation means, wherein the signal input/output circuit includes a data holding circuit which inputs the reference signal and which outputs the reference signal based on an input timing of a delayed clock signal, and a clock signal delaying circuit which delays the clock signal supplied to the data holding circuit based on the delay time.

2. The semiconductor testing device according to claim 1, further comprising a data delaying circuit which delays the reference signal supplied to the data holding circuit.

3. The semiconductor testing device according to claim 1, wherein the clock signal delaying circuit is configured by a phase shift circuit.

4. The semiconductor testing device according to claim 1, wherein the data holding circuit includes a flip-flop.

5. A timing generator for a semiconductor test system, comprising:
   A delay time calculation means for calculating a delay time given to the reference signal;
   A clock signal delaying circuit which inputs clock signal and outputs delayed clock signal to a data holding circuit based on the delay time;
   A data delaying circuit which delays the reference signal supplied to the data holding circuit based on the delayed clock signal from the clock signal delaying circuit;
   Wherein the data holding circuit inputs the delayed reference signal from the data delay circuit and outputs the delayed reference signal based on an input timing of the delayed clock signal;
   Wherein the data holding circuit is directly connected to the output of the clock signal delaying circuit and the data delaying circuit through corresponding input terminals.

* * * * *